United States Patent
Jiang et al.

(10) Patent No.: US 9,930,810 B2
(45) Date of Patent: Mar. 27, 2018

(54) AISLE CONTAINMENT ROOF SYSTEM HAVING A FIXED PERFORATED PANEL AND A MOVABLE PERFORATED PANEL

(71) Applicant: SCHNEIDER ELECTRIC IT CORPORATION, West Kingston, RI (US)

(72) Inventors: Yuchun Jiang, Saint Peters, MO (US); Barry Rimler, Rockville, CT (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 14/927,686

(22) Filed: Oct. 30, 2015

(65) Prior Publication Data

US 2017/0121966 A1    May 4, 2017

(51) Int. Cl.
| | |
|---|---|
| *H05K 7/20* | (2006.01) |
| *E04B 1/94* | (2006.01) |
| *A62C 35/68* | (2006.01) |
| *A62C 37/10* | (2006.01) |

(Continued)

(52) U.S. Cl.
CPC ......... *H05K 7/20709* (2013.01); *E04B 1/947* (2013.01); *A62C 35/68* (2013.01); *A62C 37/10* (2013.01); *E04B 1/945* (2013.01); *E04D 13/00* (2013.01); *G08B 21/18* (2013.01)

(58) Field of Classification Search
CPC ............ H05K 7/20745; H05K 7/20709; E04B 1/945; E04B 1/947
See application file for complete search history.

(56) References Cited

U.S. PATENT DOCUMENTS

| | | | |
|---|---|---|---|
| 3,410,194 A | 11/1968 | Reusch | |
| 3,509,812 A | 5/1970 | James | |

(Continued)

FOREIGN PATENT DOCUMENTS

| | | |
|---|---|---|
| CN | 102150483 A | 8/2011 |
| CN | 102272530 A | 12/2011 |

(Continued)

OTHER PUBLICATIONS

Extended European Search Report from corresponding European Application No. 16196082.8 dated Mar. 16, 2017.

*Primary Examiner* — Gisele D Ford
(74) *Attorney, Agent, or Firm* — Lando & Anastasi, LLP (57) ABSTRACT

An aisle containment roof system includes a frame configured to be supported by two rows of racks or by the one row of racks and a wall or by a dedicated frame structure independent of the two rows of racks. The aisle containment roof system further includes a fixed perforated panel fixedly secured to the frame. The fixed perforated panel includes a pattern of openings formed therein. The aisle containment roof system further includes a movable perforated panel movably secured to the frame. The movable perforated panel has a pattern of openings corresponding to the pattern of openings of the fixed perforated panel. The aisle containment roof system further includes a mechanism configured to move the movable perforated panel relative to the fixed perforated panel to align the openings of the movable perforated panel to the openings of the fixed perforated panel.

9 Claims, 7 Drawing Sheets

(51) Int. Cl.
*E04D 13/00* (2006.01)
*G08B 21/18* (2006.01)

(56) References Cited

U.S. PATENT DOCUMENTS

| | | | | |
|---|---|---|---|---|
| 5,120,273 A | * | 6/1992 | Lin | E06B 7/02 |
| | | | | 454/195 |
| 5,619,824 A | | 4/1997 | Russell et al. | |
| 6,131,340 A | * | 10/2000 | Clark | B63B 43/24 |
| | | | | 114/202 |
| 6,672,955 B2 | | 1/2004 | Charron | |
| 7,656,660 B2 | | 2/2010 | Hoeft et al. | |
| 7,990,709 B2 | | 8/2011 | Campbell et al. | |
| 8,037,644 B2 | | 10/2011 | Hall | |
| 8,713,869 B1 | | 5/2014 | Eychaner et al. | |
| 9,145,677 B2 | | 9/2015 | Wang et al. | |
| 2004/0223300 A1 | * | 11/2004 | Fink | H05K 7/20 |
| | | | | 361/690 |
| 2006/0139877 A1 | | 6/2006 | Germagian et al. | |
| 2006/0260338 A1 | | 11/2006 | VanGilder et al. | |
| 2008/0291626 A1 | | 11/2008 | Nelson et al. | |
| 2009/0014397 A1 | * | 1/2009 | Moss | G06F 1/20 |
| | | | | 211/26.2 |
| 2009/0107652 A1 | | 4/2009 | VanGilder et al. | |
| 2009/0129015 A1 | | 5/2009 | Nobile | |
| 2009/0129016 A1 | | 5/2009 | Hoeft et al. | |
| 2009/0173017 A1 | | 7/2009 | Hall | |
| 2010/0048119 A1 | * | 2/2010 | Tashiro | H05K 7/20745 |
| | | | | 454/184 |
| 2010/0061057 A1 | | 3/2010 | Dersch et al. | |
| 2010/0243180 A1 | * | 9/2010 | Hoberman | E04B 1/86 |
| | | | | 160/218 |
| 2010/0263825 A1 | * | 10/2010 | Noteboom | H05K 7/20736 |
| | | | | 165/47 |
| 2010/0277277 A1 | | 11/2010 | Green et al. | |
| 2010/0307716 A1 | * | 12/2010 | Bean, Jr. | H05K 7/20745 |
| | | | | 165/80.2 |
| 2010/0315775 A1 | * | 12/2010 | Grantham | H05K 7/20745 |
| | | | | 361/688 |
| 2011/0028081 A1 | * | 2/2011 | Hopkins | F24F 11/043 |
| | | | | 454/259 |
| 2011/0036554 A1 | | 2/2011 | Scheidler et al. | |
| 2011/0108207 A1 | | 5/2011 | Mainers et al. | |
| 2011/0271610 A1 | | 11/2011 | Cottuli et al. | |
| 2011/0278998 A1 | | 11/2011 | Caveney et al. | |
| 2011/0278999 A1 | | 11/2011 | Caveney et al. | |
| 2011/0289732 A1 | * | 12/2011 | Schulte | B60J 1/16 |
| | | | | 16/96 R |
| 2012/0035781 A1 | * | 2/2012 | Archibald | H05K 7/20745 |
| | | | | 700/300 |
| 2012/0083197 A1 | | 4/2012 | Rodriguez | |
| 2012/0181906 A1 | | 7/2012 | Caveney | |
| 2012/0281352 A1 | | 11/2012 | Namek et al. | |
| 2012/0300391 A1 | * | 11/2012 | Keisling | H05K 7/20745 |
| | | | | 361/679.46 |
| 2013/0210335 A1 | * | 8/2013 | Krietzman | H05K 5/0213 |
| | | | | 454/184 |
| 2014/0038510 A1 | * | 2/2014 | Bailey | H05K 7/20745 |
| | | | | 454/339 |
| 2014/0211411 A1 | * | 7/2014 | Slaby | H05K 7/20745 |
| | | | | 361/679.46 |
| 2014/0321050 A1 | * | 10/2014 | Sato | G06F 1/20 |
| | | | | 361/679.47 |
| 2015/0036293 A1 | * | 2/2015 | Martini | F24F 11/0001 |
| | | | | 361/695 |
| 2015/0259938 A1 | * | 9/2015 | Bernard | E04H 1/005 |
| | | | | 52/64 |

FOREIGN PATENT DOCUMENTS

| | | |
|---|---|---|
| DE | 721631 C | 6/1942 |
| DE | 1753268 B1 | 7/1971 |
| DE | 2454239 A | 5/2009 |
| DE | 102009003652 A1 | 9/2010 |
| EP | 2847395 A1 | 3/2015 |
| WO | 2010105618 A1 | 9/2010 |
| WO | 2013166708 A1 | 11/2013 |

\* cited by examiner

AISLE CONTAINMENT ROOF SYSTEM HAVING A FIXED PERFORATED PANEL AND A MOVABLE PERFORATED PANEL

BACKGROUND OF THE INVENTION

1. Field of the Invention

The present disclosure relates to racks and enclosures, and more particularly to equipment used to contain and manage air used to cool data processing, networking and telecommunications equipment housed in equipment racks.

2. Discussion of Related Art

In order to control the flow of air throughout a data center, and to optimize the air flow through equipment racks provided in the data center, it may be desirable to contain the air within hot and cold aisles to conserve energy and to lower cooling cost by managing air flow. As a result, hot aisle containment systems have been developed to contain and manage air within the hot aisle. Cold air containment systems have been developed as well. With both containment systems, the aisle roof and doors need to be closed during normal operation. One disadvantage associated with a typical hot aisle containment system is that a ceiling of the air containment system may block or otherwise prevent a sprinkler system of the data center from deploying during an emergency. Thus, such an air containment system often requires a separate sprinkler (suppression) system embedded within the air containment system.

Figure 1:
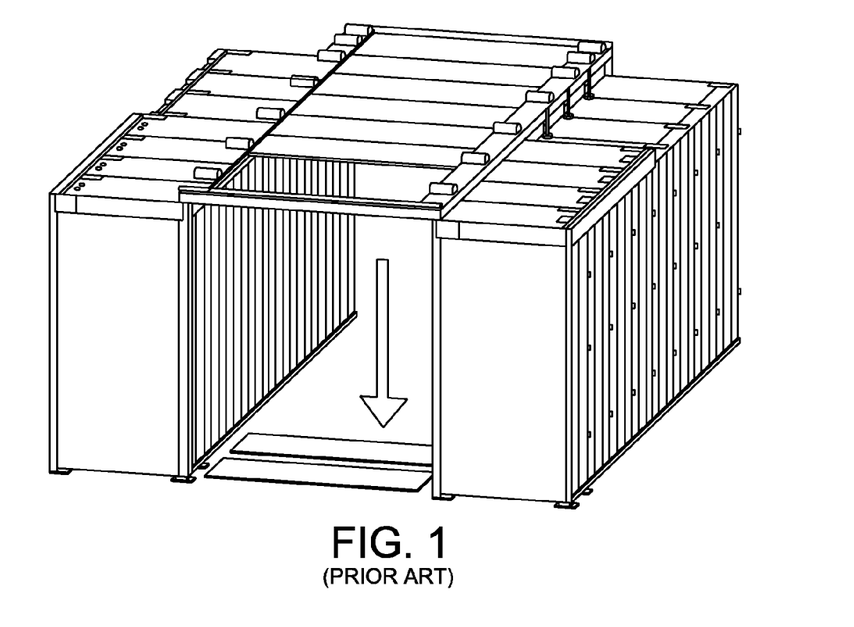
FIG. 1 is a perspective view of a prior art aisle containment roof system having drop-down roof panels.
Figure 2:
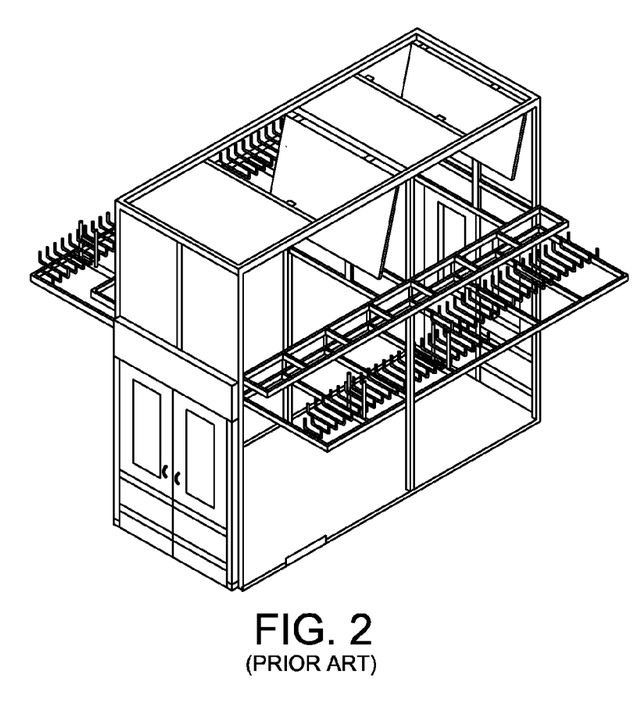
FIG. 2 is a perspective view of a prior art aisle containment roof system having hinged roof panels.

Currently, in one embodiment, the data center aisle containment roof system may include drop-down roof panels, such as the system disclosed in U.S. Patent Application Publication No. 2015/0113883 A1, entitled ELECTROMAGNETIC LOCK DROP CEILING FOR AISLE CONTAINMENT SYSTEM AND METHOD, which is illustrated in FIG. 1. As shown, when fire or smoke is detected, panel retainers are released, and the panels drop to the floor so the sprinkler spray can reach the aisle. In another embodiment, the system may have hinged roof panels, which is illustrated in FIG. 2. As shown, when fire or smoke is detected, the hinged roof panels release on one edge and hang vertically on the other edge so that the sprinkler spray can reach the aisle. In other embodiments, the system may have fixed roof panels having sprinkler heads that extend through the fixed panels.

SUMMARY OF THE INVENTION

One aspect of the present disclosure is directed to an aisle containment roof system configured to span an aisle formed by two rows of racks or by one row of racks and a wall to form a ceiling. In one embodiment, the aisle containment roof system comprises a frame configured to be supported by the two rows of racks or by the one row of racks and the wall or by a dedicated frame structure independent of the two rows of racks. The aisle containment roof system further comprises a fixed perforated panel fixedly secured to the frame. The fixed perforated panel includes a pattern of openings formed therein. The aisle containment roof system further comprises a movable perforated panel movably secured to the frame. The movable perforated panel has a pattern of openings corresponding to the pattern of openings of the fixed perforated panel. The aisle containment roof system further comprises a mechanism configured to move the movable perforated panel relative to the fixed perforated panel to align the openings of the movable perforated panel to the openings of the fixed perforated panel.

Embodiments of the aisle containment roof system further may include a control module to control the operation of the electromagnetic assembly. The control module may be configured to move the electromagnetic assembly between a magnetized condition in which the electromagnetic assembly retains the movable perforated panel in the other of the closed and opened positions and an de-magnetized condition in which the electromagnetic assembly releases the movable perforated panel to allow the movable perforated panel to move to the one of the closed and opened positions. The aisle containment roof system further may comprise an alarm coupled to the control module and configured to activate when the electromagnetic assembly disengages the movable perforated panel. The aisle containment roof system further may comprise at least one includes spring loaded plunger to secure the frame to a frame structure. The movable perforated panel may be configured to move from a closed position when the openings on fixed and movable perforated panels are offset with respect to one another and an opened position when the openings are aligned. The mechanism may include at least one spring assembly configured to bias the movable perforated panel to one of the closed and opened positions. The at least one spring assembly may include a bracket secured to the frame, a bolt secured to the bracket, and a compression spring disposed between the bolt and held in place between the bracket and a washer provided on the bolt. The at least one spring assembly may be configured to bias a strip of metal provided on the movable perforated panel to the opened position. The mechanism further may include an electromagnetic assembly configured to maintain the movable perforated panel in the other of the closed and opened positions and to release the movable perforated panel when a predetermined condition is detected. The electromagnetic assembly may include a bracket secured to the frame and an electromagnet positioned to engage the movable perforated panel. The electromagnet may be positioned to engage a metallic disc secured to a strip of metal extending from the movable perforated panel. The mechanism further may include an air cylinder configured to move the movable perforated panel back to one of the closed and opened positions.

Another aspect of the present disclosure is directed to a method comprising: providing aisle containment roof system configured to span an aisle formed by two rows of racks or by one row of racks and a wall to form a ceiling, the aisle containment roof system comprising a frame configured to be supported by the two rows of racks or by the one row of racks and the wall or by a dedicated frame structure independent of the two rows of racks, a fixed perforated panel fixedly secured to the frame, the fixed perforated panel including a pattern of openings formed therein, a movable perforated panel movably secured to the frame, the movable perforated panel having a pattern of openings corresponding to the pattern of openings of the fixed perforated panel, and a mechanism configured to move the movable perforated panel relative to the fixed perforated panel to align the openings of the movable perforated panel to the openings of the fixed perforated panel, the movable perforated panel being configured to move from a closed position when the openings on fixed and movable perforated panels are offset with respect to one another and an opened position when the openings are aligned; detecting a predetermined condition; and moving the movable perforated panel to the opened position.

Embodiments of the method further may include biasing the movable perforated panel to one of the closed and opened positions. Moving the movable perforated panel may include moving the movable perforated panel to the other of the closed and opened positions. The movable perforated panel may be biased to the one of the closed and opened positions by at least one spring assembly. The movable perforated panel may be moved by an electromagnetic assembly configured to maintain the movable perforated panel in the other of the closed and opened positions and to release the movable perforated panel when a predetermined condition is detected. The predetermined condition may be a temperature within the aisle greater than a set temperature or smoke detected within the aisle. The method further may comprise operating an alarm to warn individuals within the aisle. Upon detecting a predetermined condition, the alarm may include a visual alarm and/or a sound alarm.

The present disclosure will be more fully understood after a review of the following figures, detailed description and claims.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which.

DETAILED DESCRIPTION OF THE PREFERRED EMBODIMENTS

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks, which are designed to house electronic equipment including but not limited to data processing, networking and telecommunications equipment. Each equipment rack may be configured to include a frame or housing adapted to support the electronic equipment. The housing includes a front, a back, opposite sides, a bottom and a top. The front of each equipment rack may include a front door so as to enable access into the interior of the equipment rack. The sides of the equipment rack may include one or more panels to enclose the interior region of the rack. The back of the equipment rack may also include one or more panels or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. In other embodiments, the front door may include a removable panel.

The equipment racks are modular in construction and configured to be rolled into and out of position, e.g., within a row of the data center. Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to the equipment racks.

As discussed above, data centers are typically configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks in which the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

In order to address the heat build-up and hot spots within the data center or equipment room, and to address climate control issues within the data center or room in general, a cooling system may be provided. In one configuration, the cooling system may be provided as part of the data center infrastructure. In another configuration, the data center's cooling system may be supplemented with the CRAC units described above. With yet another configuration, a modular cooling system may be provided in which modular cooling racks are interspersed within the rows of equipment racks.

In one embodiment, a management system may be provided to monitor and display conditions of the equipment racks, including the cooling racks. The management system may operate independently to control the operation of the equipment and cooling racks, and may be configured to communicate with a higher level network manager or with a management system associated with the data center. In certain circumstances, it may be desirable control the air flow within the hot and cold aisles, and in the hot aisles in particular. Typically, heat generated from electronic components housed within the equipment racks is exhausted out of the backs of the equipment racks into the hot aisles. It may be desirable to contain the hot air for conditioning by a cooling unit, such as the modular cooling unit described above. It is known to enclose the hot aisle with a ceiling assembly that is designed for the particular equipment rack configuration. Such ceiling assemblies are typically installed when installing the equipment racks in the data center and are manufactured by the manufacturers of the equipment racks. Known ceiling assemblies are awkward to lift overhead and install, and require precise spacing between the rows of equipment racks. Moreover, such ceiling assemblies may block or otherwise prevent a sprinkler system of the data center from deploying during an emergency. Thus, in certain embodiments, such ceiling assemblies often require a separate sprinkler or suppression system embedded within the assembly.

Embodiments of an aisle containment roof system of the present disclosure may include two perforated panels with identical perforation patterns. A bottom panel is fixed on a frame structure that is secured to the equipment racks or to a frame spanning the equipment racks, and a top panel slides on top of the bottom panel. The top panel is spring loaded and released by an electromagnetic assembly when fire or smoke is detected. The controlled movement of the top panel provides two roof configurations, a closed position when the openings on two panels are offset and an opened position when the openings are aligned. The closed position works as normal aisle containment to contain air within the enclosed aisle and the opened position allows sprinkler spay to penetrate the roof. The aisle containment roof system also may include a tool-less feature for mounting the roof system to a containment frame.

Figure 3:
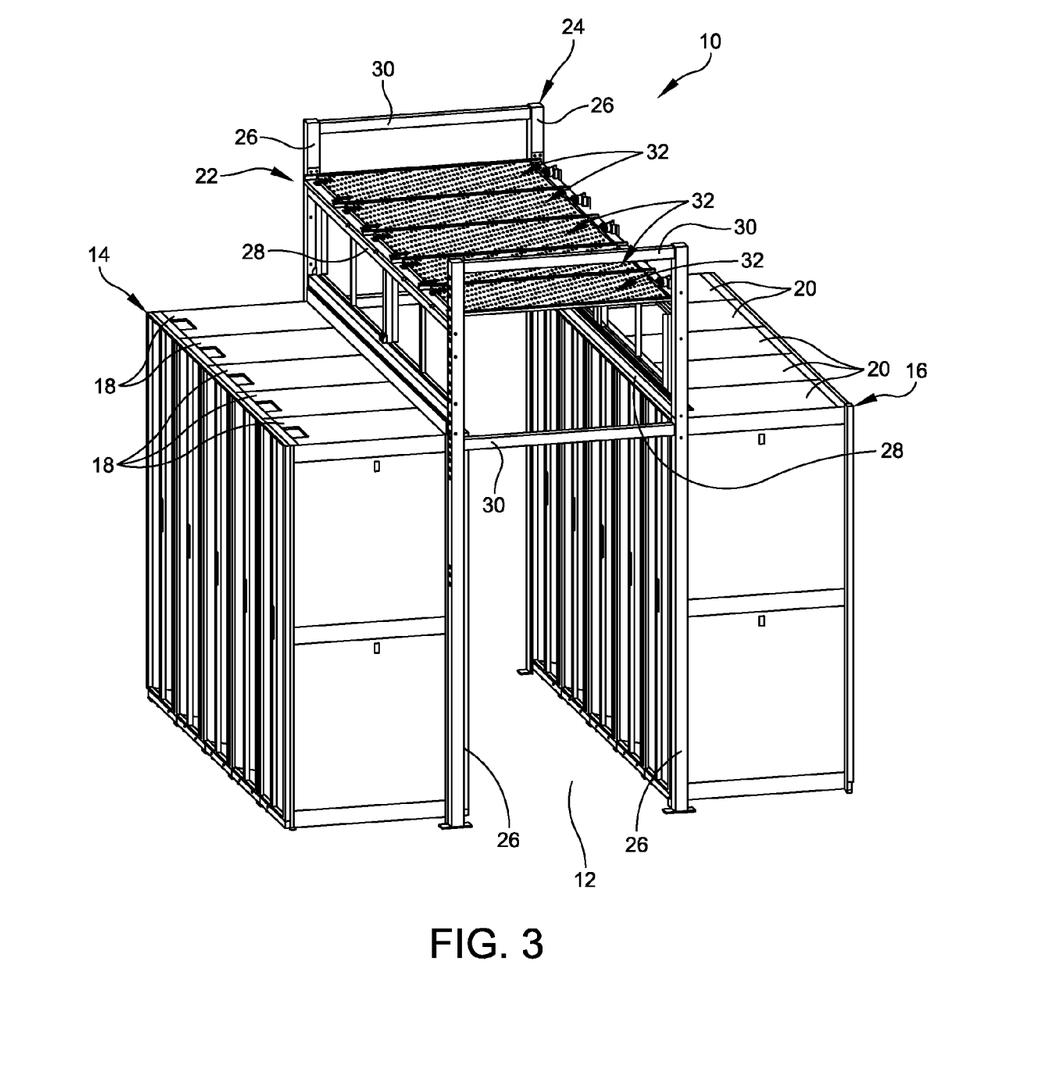
FIG. 3 is a perspective view of an aisle containment roof system fully installed on an independent frame structure so that the system spans an aisle formed by two rows of equipment racks.

Referring now to the drawings, and more particularly to FIG. 3, a portion of a data center, generally indicated at 10, is illustrated. In particular, an aisle, such as a hot aisle 12, is located between two rows of equipment racks, generally indicated at 14, 16. The principles described herein may be applied to any aisle within the data center, including cold aisles. The hot aisle 12 is being shown for illustration purposes only. As shown, the first row of racks 14 is positioned so that the fronts of the racks face outwardly. Similarly, the second row of racks 16 is positioned so that the fronts of the racks face outwardly and the backs of the racks face the backs of the first row of racks 14. By way of example only, the first row of racks 14 includes five equipment racks, each indicated at 18, and the second row of racks 16 includes five equipment racks 20. One or more equipment racks 18, 20 may be replaced by a cooling rack.

The arrangement is such that hot air is exhausted through the backs of the equipment racks 18 into the hot aisle 12 formed between the first row 14 and the second row 16. As discussed above, this aisle may sometimes be referred to herein as the "hot" or "warm" aisle. As shown in FIG. 3, air is capable of escaping from the hot aisle 12 above the equipment racks 18, 20. As is well known, warm air rises, thus creating a situation in which the ceiling of the data center 10 may become too warm. This situation may negatively affect the climate control within the data center 10. An aisle containment roof system of an embodiment of the present disclosure is designed to control the flow of warm air within the data center 10, and within the space between the equipment racks 18, 20 specifically.

Still referring to FIG. 3, an aisle containment roof system, generally indicated at 22, is provided to contain hot air within the hot aisle 12. As shown, the aisle containment roof system includes a frame structure, generally indicated at 24, which is designed to be positioned between the first and second rows 14, 16 and span the hot aisle 12. The frame structure 24 includes four vertical posts, each indicated at 26, four side cross members, each indicated at 28, which are positioned adjacent the first row 14 of equipment racks 18 and adjacent the second row 16 of equipment racks 20, and four end cross members, each indicated at 30, provided at the ends of the first and second rows of equipment racks. The frame structure 24 is configured to support a plurality of ceiling panel assemblies, each generally indicated at 32. Each ceiling panel assembly 32 is rectangular in shape having a width and a length sufficient to extend across the width of the aisle 12. For example, the width of each ceiling panel assembly 32 may be selected to correspond to a width of the equipment rack 18, 20.

Figure 4:
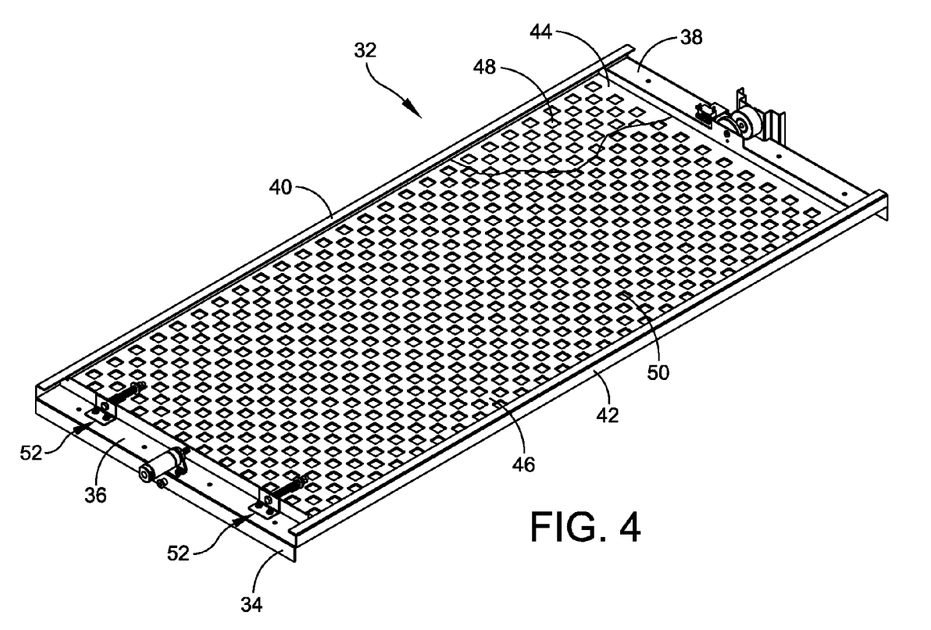
FIG. 4 is a perspective view of the aisle containment roof system having a fixed perforated panel and a movable perforated panel of an embodiment of the present disclosure.

Referring additionally to FIG. 4, each ceiling panel assembly 32 includes a rectangular frame 34 having two end rails 36, 38 and two side rails 40, 42. The frame 34 is configured to support a fixed perforated panel 44, which is fixedly secured to the frame, and a movable perforated panel 46, which is movably secured to the frame and movable with respect to the fixed perforated panel in the manner described below. In one embodiment, the frame 34 and the fixed and movable perforated panels 44, 46 of each ceiling panel assembly 32 may be fabricated from any suitable strong, lightweight material, such as aluminum. In another embodiment, the fixed and movable perforated panels may be fabricated from any suitable transparent/translucent material to enable light to pass through the panels. In FIG. 3, a portion of the movable perforated panel 46 is removed to reveal the fixed perforated panel 44.

As shown in FIG. 3, the frames 34 of adjacent ceiling panel assemblies 32 are placed closely to one another to contain the air within the hot aisle 12. Outer edges of the side rails 40, 42 of the frames 34 may be adapted to seal the edges of the side rails 40, 42 of adjacently placed frames 34 when placing the ceiling panel assemblies 32 next to each other. For example, a strip of material (not shown) may be applied to the outer edges of the side rails 40, 42 of the frames 34 of the ceiling panel assemblies 32 to assist in sealing the edges of the frames when deploying the ceiling panel assemblies.

The fixed perforated panel 44 and the movable perforated panel 46 each include identical perforation patterns. Specifically, the fixed perforated panel 44 includes a pattern of openings 48 and the movable perforated panel 46 includes a pattern of openings 50 that correspond to the pattern of openings 48 associated with the fixed perforated panel 44. The result is that the fixed perforated panel 44 is secured to the frame structure 24 that spans the rows of equipment racks 14, 16, and the movable perforated panel 46 slides on top of the fixed perforated panel, with rails 40, 42 of the frame 34 retaining the movable perforated panel.

In one embodiment, a mechanism is provided to move the move the movable perforated panel 46 between opened and closed positions. In a certain embodiment, the movable perforated panel 46 is spring loaded and released by an electromagnetic assembly when fire or smoke is detected. The controlled movement of the movable perforated panel 46 provides two roof configurations, a closed position when the pattern of opening 48 of the fixed perforated panel 44 are offset with respect to the pattern of openings 50 of the movable perforated panel 46 and an opened position when the patterns of openings of the fixed and movable panels are aligned. The closed position works as normal aisle containment to contain air within the enclosed hot aisle 12 and the opened position allows sprinkler spay to penetrate the panels 44, 46 of the ceiling panel assemblies 32. The aisle containment roof system 22 also may include a tool-less feature for mounting the ceiling panel assemblies 32 to the frame structure 24. Although the drawings illustrate the patterns of openings 48, 50 of the fixed and movable perforated panels 44, 46 as having rectangular openings, it should be understood that the openings of the panels may be configured as any shape and/or size, e.g., circular.

Figure 5:
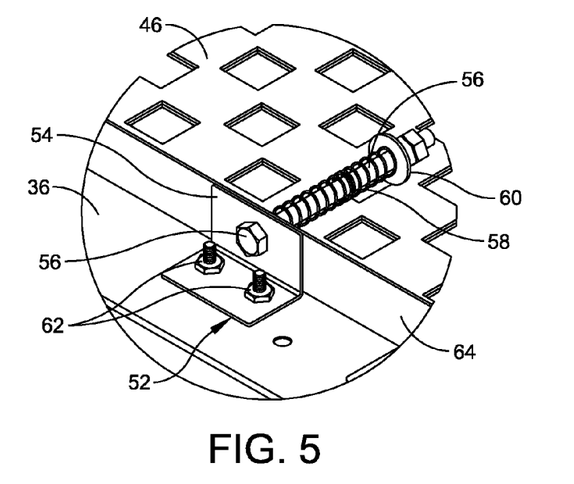
FIG. 5 is an enlarged perspective view of a bracket and a compression spring of the aisle containment roof system used to move the movable perforated panel.

Referring additionally to FIG. 5, the mechanism of the aisle containment roof system 32 includes two spring assemblies, each generally indicated at 52, provided at one end of the frame 34, e.g., end rail 36. The spring assemblies 52 are configured to provide a biasing force on the movable perforated panel 46 to maintain the movable perforated panel in the opened position. In one embodiment, each spring assembly includes a bracket 54 that is secured to the end rail 36 of the frame 34, a bolt 56 that is secured to the bracket, and a compression spring disposed on the bolt and held in place between the bracket and a washer 60 provided on the bolt. The bracket 54 is secured to the end rail 36 of the frame 34 by a pair of screw fasteners, each indicated at 62, and positioned to engage a strip of metal 64 extending perpendicularly from the end rail 36 of the movable perforated panel 46, with the bolt 56 extending through an opening formed in the strip of metal. The compression spring 58 is held in place between the strip of metal 64 and the washer 60 provided at the other end of the bolt. The arrangement is such that the two spring assemblies 52 bias the movable perforated panel 46 to the opened position in which the patterns of openings 48, 50 of the fixed and movable perforated panels 44, 46 are aligned to enable spray fluid from sprinklers to move through the openings. It should be understood that the spring assemblies 52 may bias the movable perforated panel 46 to the closed position.

Figure 6:
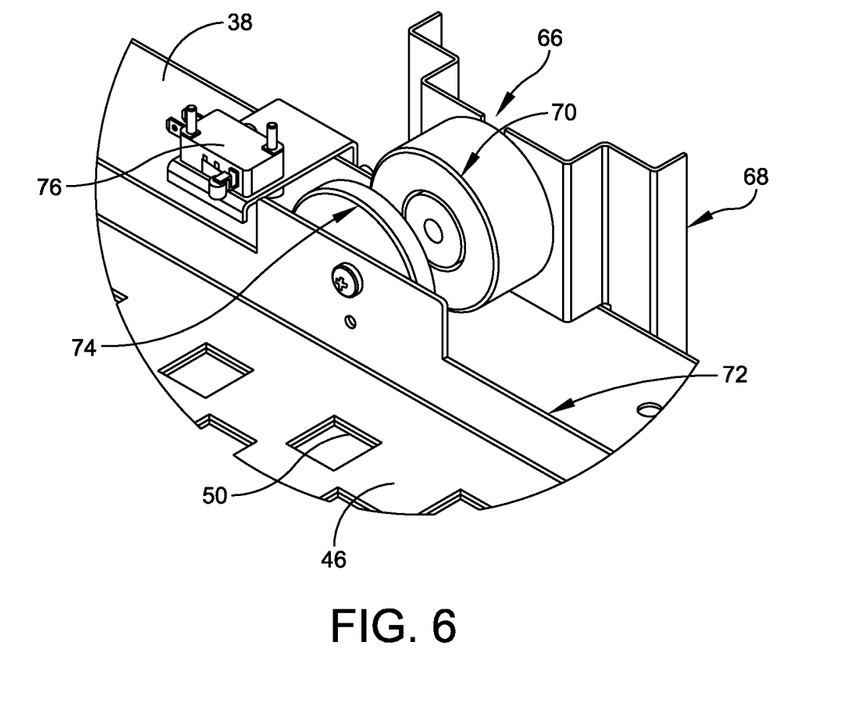
FIG. 6 is an enlarged perspective view of an electromagnetic assembly of the aisle containment roof system used to release the movable perforated panel.

Referring to FIG. 6, the mechanism of the aisle containment roof system 32 further includes an electromagnetic assembly generally indicated at 66 provided on the end rail 38 of the frame 34. The electromagnetic assembly 66 is configured to releasably secure the movable perforated panel 46 in the closed position against the bias of the spring assemblies 52. In the event of fire or smoke detected by an appropriate detection system, the electromagnetic assembly 66 releases the movable perforated panel 46 so that the spring assemblies 52 exert their biasing force on the movable perforated panel to move the movable perforated panel to the opened position.

In one embodiment, the electromagnetic assembly 66 includes a bracket 68 that is secured to the end rail 38 of the frame 34 of the fixed perforated panel 44 and an electromagnet 70 that is secured to the bracket. The bracket 68 is mounted on the end rail 38 of the frame 34 by any suitable method, and the electromagnet 70 is positioned to engage another strip of metal 72 extending perpendicularly from the movable perforated panel 46. As shown, the strip of metal 72 has a portion that extends above the remainder of the strip of metal on which a metallic disc 74 is secured. The electromagnet 70 and the metallic disc 74 are configured to be magnetically secured to one another to maintain the movable perforated panel 46 in the closed position. The electromagnet 70 can be de-magnetized from one another to enable the spring assemblies 52 to exert their biasing force on the movable perforated panel 46 to the closed position.

In one embodiment, the electromagnet 70 may include a magnet that is capable of being selectively energized to attract to the metallic disc 74. The metallic disc 74 may include a base metal material that is attracted to a magnet. The operation of the electromagnetic assembly 66 may be achieved by any suitable mechanism configured to magnetize and de-magnetize the electromagnet 70. In certain embodiments, the electromagnetic assembly 66 may be activated upon the occurrence of a predetermined condition. For example, the predetermined condition may be the occurrence of a temperature within the hot aisle 12 that is greater than a set temperature. In one particular example, the set temperature may be 135° F. In one embodiment, the activation of the electromagnetic assemblies 66 of the aisle containment roof systems 22 may be coordinated to occur simultaneously so that the movable perforated panels 46 are released at the same time. In such an embodiment, the electromagnets 70 of the electromagnetic assemblies 66 are de-magnetized simultaneously to release the movable perforated panels 46. In other embodiments, when a predetermined condition occurs, an alarm may be triggered prior to activating the electromagnets 70 of the electromagnetic assemblies 66 to enable operators or other personnel within the aisle some time to exit the hot aisle 12.

A micro-switch 76 is provided to move manually or automatically the movable perforated panel 46 to the closed position while the electromagnetic assembly 66 is energized. In one embodiment, the aisle containment roof system 22 can include a position indicating device, which can be a micro switch, reed switch, proximity switch, pneumatic switch, photo electric switch, contacts, or a switch or position indicator of any binary or analog technology able to communicate whether the aisle containment roof system is open or closed, or in the case of analog measurement, open, closed or somewhere in between. Each aisle containment roof system 22, by the position indicating device, can aid in automatically resetting the movable perforated panel 46 to its opened position. Autonomous visual inspection can be performed, or other means that may initiate manual remote or automatic retting of the aisle containment roof system 22 may be assisted, supervised or performed though an automatic reset function. The automatic reset function reads all position indicating device(s) following a manual remote reset or an automatic reset command and issues an additional automatic reset command in the event that any of the aisle containment roof system. Each aisle containment roof system 22 may remain open by any position indicating device, indicating an open aisle containment roof system. The automatic reset function can measure the position of each aisle containment roof system after each reset attempt, and following an adjustable or preset time delay, attempt another reset until a maximum number of resets (as designed into or programmed into the automatic reset device), have been attempted. Once the maximum number of resets is attempted, no further automatic reset can be initiated. In a certain embodiment, the existence of open aisle containment roof system 22 following a maximum number of automatic resets can result in an alarm being issued locally, or communicated to controllers, alarm systems, automation systems or any other type of system requiring such information.

Although an electromagnetic assembly 66 is shown and described herein, other possible activation methods may include electrical, mechanical, pneumatic, hydraulic, fused link, powder activated technologies or manual intervention, or a combination thereof. Also, the use of spring assemblies 52 to propel the movable perforated panel 46 from opened position to the closed position, after the movable perforated panel is released by the electromagnetic assembly 66, can be achieved by other types of mechanisms. The spring assemblies 52 also hold the movable perforated panel 46 in opened position before the movable perforated panel is reset to closed position intentionally.

Figure 7:
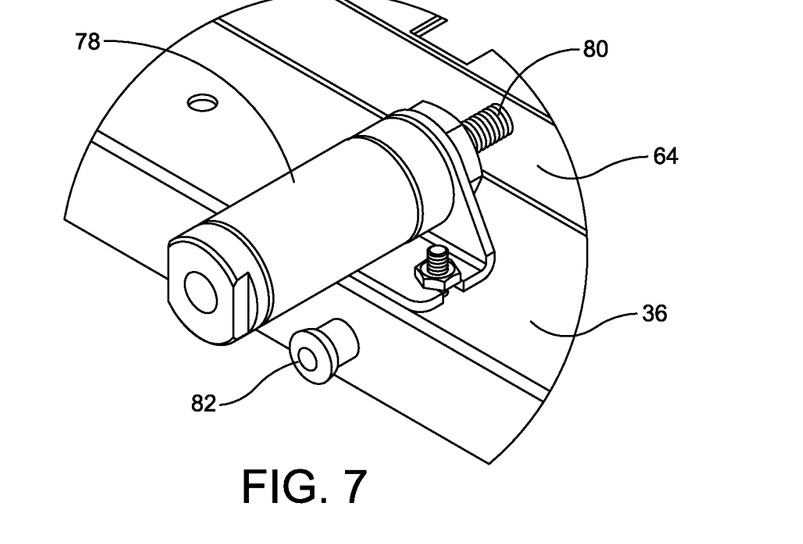
FIG. 7 is an enlarged perspective view of an air cylinder and a spring loaded plunger of the aisle containment roof system.

Referring to FIG. 7, the aisle containment roof system 22 further includes an air cylinder 78 provided on the end rail 36 of the frame 34 between the spring assemblies 52. As shown, the air cylinder 78 is designed to move the movable perforated panel 46 back to the closed position after being released to the opened position. The air cylinder 78 is secured to the end rail 36 of the frame 34 and includes a cylindrical piston 80 that engages the strip of metal 64 of the movable perforated panel 46. It should be understood that although a pneumatic system, e.g., air cylinder 78, is shown and described herein to move the movable perforated panel 46, any type of system, e.g., a hydraulic system, may be employed. The electromagnetic assembly 66 and the air cylinder 78 may be connected to a control module of the aisle containment roof system 22 to automate the release and the return of the movable perforated panel 46 from the closed position to the opened position and back to its closed position.

Figure 8:
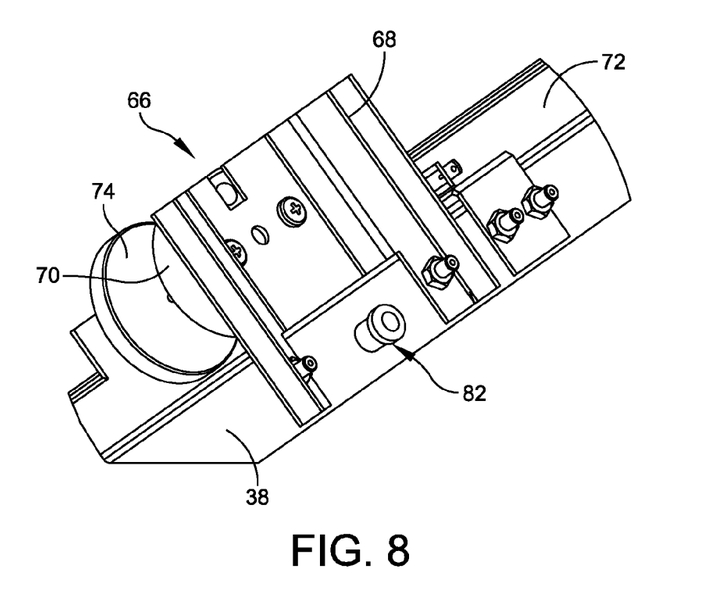
FIG. 8 is a perspective view of a portion of the aisle containment roof system.
Figure 9:
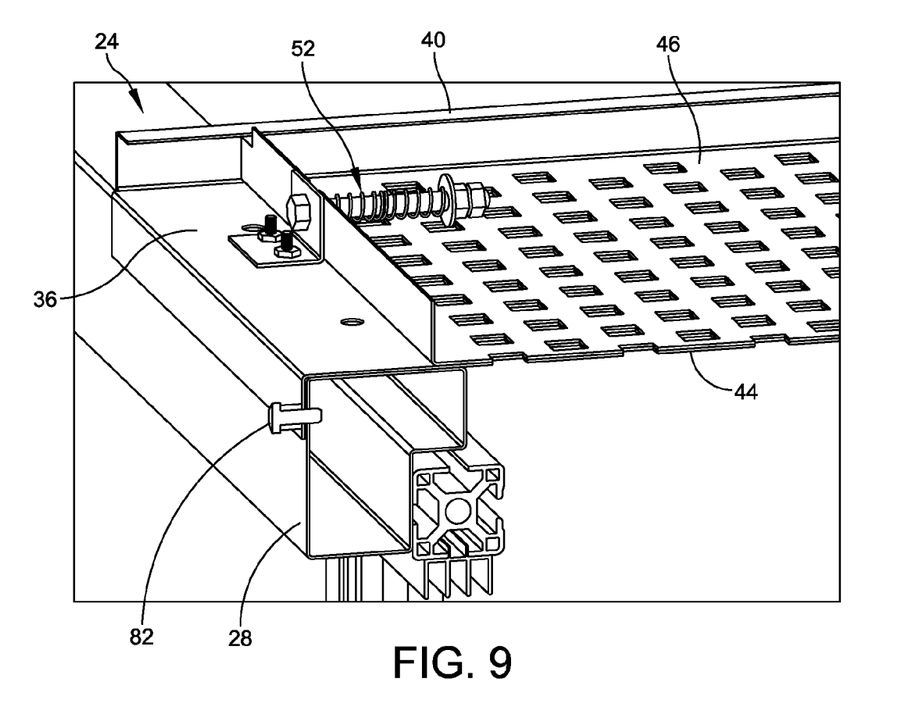
FIG. 9 is a perspective view of the aisle containment roof system being installed on the independent frame structure.

Referring to additionally to FIGS. 8 and 9, the aisle containment roof system 22 further includes a pair of spring loaded plungers, each indicated at 82, that are used to secure the frame 34 to the frame structure 24. As shown, the spring loaded plungers 82 are releasably secured to the end rails 36, 38 of the frame 34. Each spring loaded plunger 82 is designed to be secured within an opening provided in the end rail 36 or 38 of the frame 34, and to be spring loaded into a respective opening provided in the side cross member 28 or 30 of the frame structure 24 to secure and position the frame 34 on the frame structure 24.

Figure 10A:
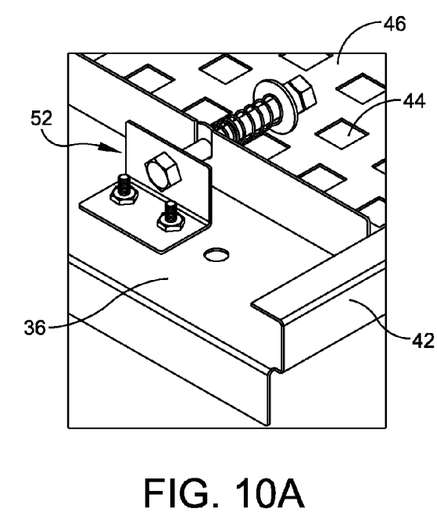
FIGS. 10A and 10B illustrate the movable perforated panel being retained in a closed position with respect to the fixed perforated panel.
Figure 10B:
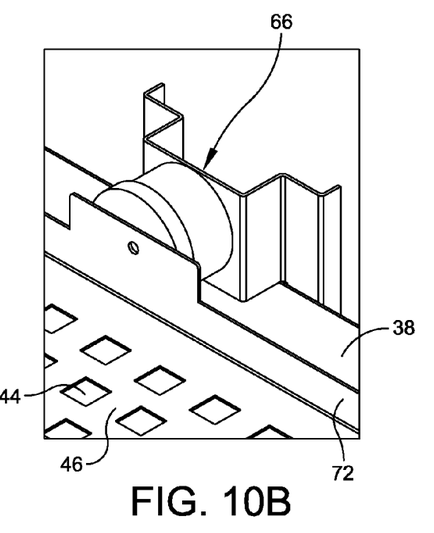

Referring to FIGS. 10A and 10B, the movable perforated panel 46 of the aisle containment roof system 22 is shown in the closed position in which the pattern of openings 48 of the movable perforated panel and the pattern of openings 50 of the fixed perforated panel 44 are offset with respect to one another to create a solid structure, thereby containing air within the hot aisle 12. As shown, the electromagnet 70 of the electromagnetic assembly 66 releasably secures the metallic disc 74 of the movable perforated panel 46 to maintain the movable perforated panel in the closed position.

Figure 11A:
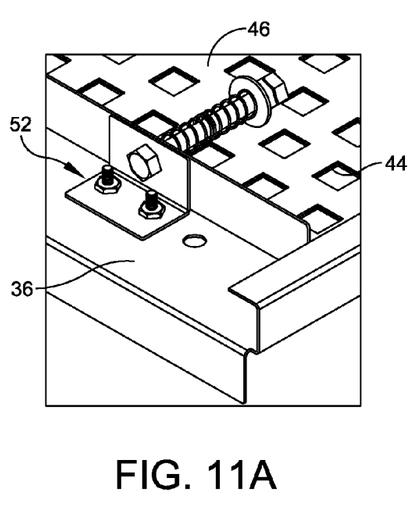
FIGS. 11A and 11B illustrate the movable perforated panel being retained in an open position with respect to the fixed perforated panel.
Figure 11B:
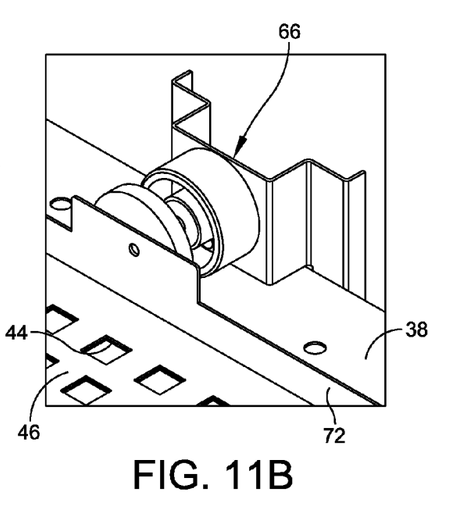

Referring to FIGS. 11A and 11B, the movable perforated panel 46 of the aisle containment roof system 22 is shown in the opened position in which the pattern of openings 50 of the movable perforated panel 46 are aligned with the pattern of openings 48 of the fixed perforated panel 44 to enable fluid (e.g., liquid from a sprinkler system) to flow through the roof defined by the aisle containment roof system. As shown, the electromagnet 70 of the electromagnetic assembly 66 releases metallic disc 74 of the movable perforated panel 46 to allow the spring assemblies 52 to move the movable perforated panel to the opened position.

Figure 12:
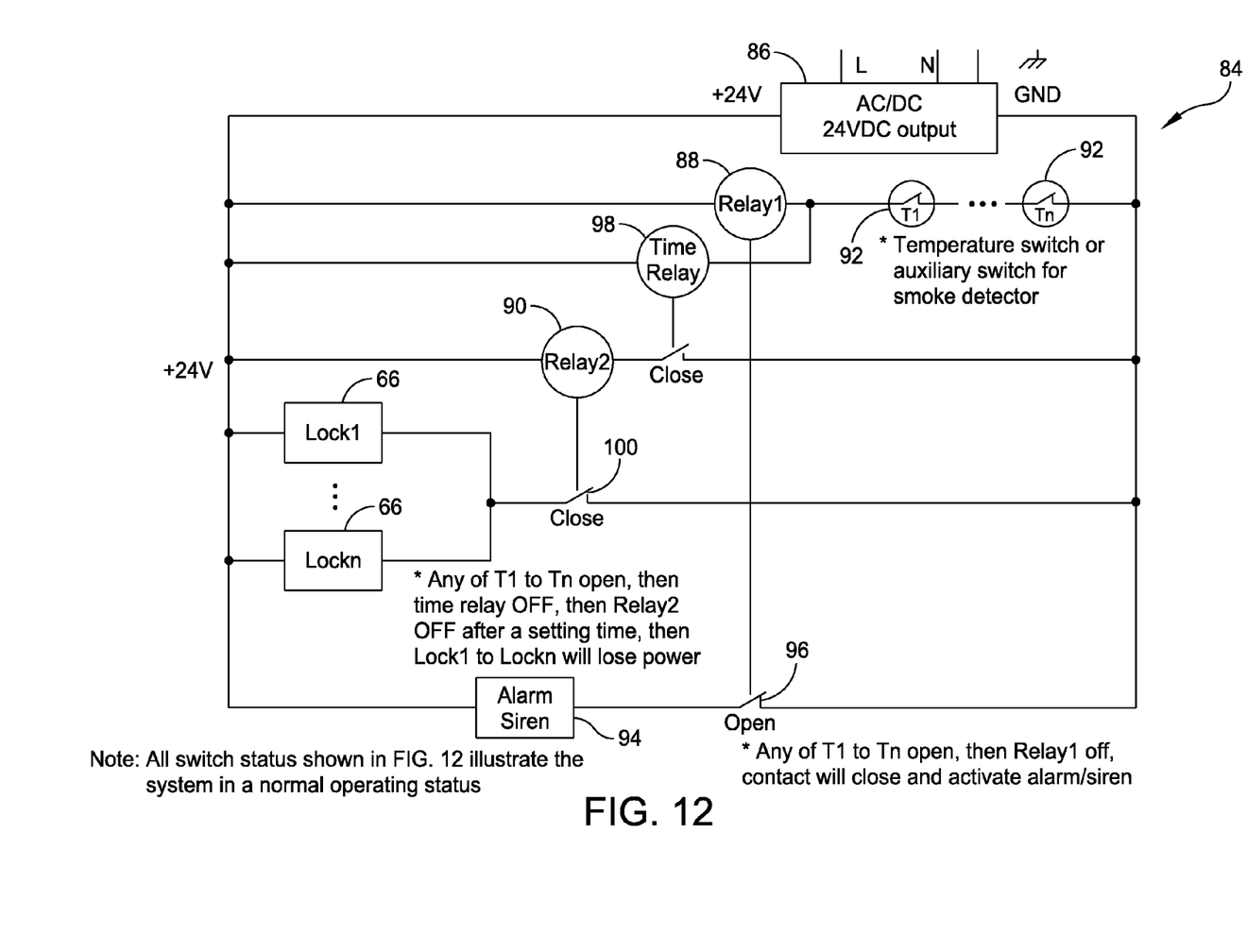
FIG. 12 is a schematic diagram of a control module of an embodiment of the disclosure.

Referring to FIG. 12, in a certain embodiment, the air containment roof system 22 further includes a control module, generally indicated at 84, to control the operation of the electromagnetic assembly 66, the micro-switch 76 and the air cylinder 78 to move the movable perforated panel. Specifically, the control module 84 is configured to de-magnetize the electromagnet 70 of the electromagnetic assembly 66 to release the metallic disc 74 of the movable perforated panel 46 so that the spring assemblies 52 bias the movable perforated panel to the opened position. The control module 84 can be further configured to control the operation of the air cylinder 78 to reset the movable perforated panel 46 back to the closed position and to control the operation of the micro-switch 76 to activate the electromagnetic assembly 66.

As shown, the control module 84 includes an AC/DC converter 86 that is connected to the electromagnetic assembly 66 by first and second relays 88, 90. Temperature sensors, each indicated at 92, are positioned between the AC/DC converter 86 and the first and second relays 88, 90. As further shown, the first relay 88 is connected to an alarm 94, which may be an audible and visual alarm, by a switch 96 that is normally in an open position. A time relay 98 may be disposed between the AC/DC converter 86 and the second relay 90, which is connected to another switch 100 that is connected to the electromagnetic assembly 66. This switch 100 is normally in a closed to maintain the electromagnetic assembly 66 and the movable perforated panel 46 in the closed position. The control unit 84 can be configured to control the operation of the micro-switch 76 and the air cylinder 78 as well.

The arrangement is such that when a predetermined condition occurs, such as the temperature within the hot aisle exceeding 135° F., or smoke being detected in the hot aisle 12, the first relay 88 closes the switch 96 connected to trigger the alarm, which may be a visual alarm, an audible alarm, or both. The time relay 98, if provided, enables a predetermined time to pass before the second relay 90 opens the switch 100 thus de-magnetizing the electromagnet 70 of the electromagnetic assembly 66 to release the movable perforated panel 46, thereby resulting in the movable perforated panel being moved by the spring assemblies 52 to the opened position. In one embodiment, the predetermined time may be seven seconds; however, any amount of time, if any, may be selected.

To assemble the ceiling panel assemblies 32 of the aisle containment roof system 22, the spring loaded plungers 82 are assembled to the frame 34. The brackets 54 of the spring assemblies 52 are secured to the end rail 36 of the frame 34. The movable perforated panel 46 is slid into the fixed perforated panel 44, which is already secured to the frame 34. The springs 58 and washers 60 of the spring assemblies 52 are assembled to apply a preload against the movable perforated panel 46. The electromagnet 70 is secured to the bracket 68 of the electromagnetic assembly 66, and the bracket 68 is secured to the end rail 38 of the frame 34.

Once assembled, each ceiling panel assembly 32 of the aisle containment roof system 22 may be installed on the frame structure 24 one at a time. The spring loaded plungers 82 are pulled when lowering the ceiling panel assembly 32 on the frame structure 24, and released to lock the ceiling panel assembly in place. The control module 84 is manipulated, e.g., by a switch, to the power to the electromagnet 70 of the electromagnetic assembly 66, which is turned on when installing the ceiling panel assemblies 32 of the aisle containment roof system 22 in their closed positions. The control module 84 holds the movable perforated panel 46 in place, and the spring assemblies 52 are provided with a larger load.

As shown, the pattern of openings 48 of the fixed perforated panel 44 and the pattern of openings 50 of the movable perforated panel 46 are offset to close the ceiling panel assembly 32 of the aisle containment roof system 22. When fire or smoke is detected, the power to electromagnetic assembly 66 is de-magnetized, thereby disabling the electromagnet 70 and enabling the spring assemblies 52 to move the movable perforated panel 46 to the opened position. In this position, the pattern of openings 48 of the fixed perforated panel 44 and the pattern of openings 50 of the movable perforated panel 46 are aligned to allow sprinkler spray to penetrate through the ceiling panel assembly 32 of the aisle containment roof system 22. Other methods of closing the aisle containment roof system 22 can be electrical, mechanical, pneumatic, hydraulic, or a combination thereof. To reset the roof panel to closed position, the process is repeated.

Thus, it should be observed that the aisle containment roof system and method of operating the aisle containment roof system within the data center as disclosed herein are particularly effective in automatically opening the roof panels when a predetermined condition occurs. The systems and methods disclosed herein reduce the cost and installation time as compared to prior art systems. The systems and methods further are adapted to be installed in existing data centers without extraordinary customization or without tools. In this regard, the systems and methods are particularly suited for accommodating any aisle width or rack height.

The spring assemblies are used to propel movable perforated panel to the opened position and to hold the movable perforated panel in the opened position. The openings of the fixed and movable perforated panels can be of any shape and size, and each panel can be made of any other material or a combination of multiple materials.

The activation and resetting of multiple aisle containment roof systems with a single activation method can be achieved manually or by a controller used to control the operation of the systems.

The mechanical construction of the panels provides guides and stops to achieve desired function. As mentioned, each panel can be made of any material, a combination of multiple materials, and can include friction reducing coating, elastomeric coating, or gasket material, to enhance operability and performance.

The aisle containment roof system can be mounted without use of tools, to a containment frame or other similar support structures.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. An aisle containment roof system configured to span an aisle formed by two rows of racks or by one row of racks and a wall to form a ceiling, the aisle containment roof system comprising:
   a frame configured to be supported by the two rows of racks or by the one row of racks and the wall or by a dedicated frame structure independent of the two rows of racks;
   a fixed perforated panel fixedly secured to the frame, the fixed perforated panel including a pattern of openings formed therein;
   a movable perforated panel movably secured to the frame, the movable perforated panel having a pattern of openings corresponding to the pattern of openings of the fixed perforated panel; and
   a mechanism configured to move the movable perforated panel relative to the fixed perforated panel to align the openings of the movable perforated panel with the openings of the fixed perforated panel,
   the movable perforated panel being configured to move between a closed position in which the pattern of openings of the fixed perforated panel and the pattern of openings of the movable perforated panel are offset with respect to one another and an opened position in which the pattern of openings of the fixed perforated panel and the pattern of openings of the movable perforated panel are aligned with respect to one another,
   the mechanism including at least one spring assembly configured to bias the movable perforated panel to one of the closed and opened positions, and
   wherein the at least one spring assembly includes a bracket secured to the frame, a bolt secured to the bracket, a washer provided on the bolt, and a compression spring disposed over the bolt and held in place between the bracket and the washer.

2. An aisle containment roof system configured to span an aisle formed by two rows of racks or by one row of racks and a wall to form a ceiling, the aisle containment roof system comprising:
   a frame configured to be supported by the two rows of racks or by the one row of racks and the wall or by a dedicated frame structure independent of the two rows of racks;
   a fixed perforated panel fixedly secured to the frame, the fixed perforated panel including a pattern of openings formed therein;
   a movable perforated panel movably secured to the frame, the movable perforated panel having a pattern of openings corresponding to the pattern of openings of the fixed perforated panel; and
   a mechanism configured to move the movable perforated panel relative to the fixed perforated panel to align the pattern of openings of the movable perforated panel with the pattern of openings of the fixed perforated panel,
   wherein the movable perforated panel is configured to move between a closed position in which the pattern of openings of the fixed perforated panel and the pattern of openings of the movable perforated panel are offset with respect to one another and an opened position in which the pattern of openings of the fixed perforated panel and the pattern of openings of the movable perforated panel are aligned with respect to one another,
   wherein the mechanism includes at least one spring assembly configured to bias the movable perforated panel to one of the closed and opened positions,
   wherein the mechanism further includes an electromagnetic assembly configured to maintain the movable perforated panel in the other of the closed and opened positions and to release the movable perforated panel when a predetermined condition is detected.

3. The aisle containment roof system of claim 2, wherein the electromagnetic assembly includes a bracket secured to the frame and an electromagnet positioned to engage the movable perforated panel.

4. The aisle containment roof system of claim 3, wherein electromagnet is positioned to engage a metallic disc secured to a strip of metal extending from the movable perforated panel.

5. The aisle containment roof system of claim 2, wherein the mechanism further includes an air cylinder configured to move the movable perforated panel back to one of the closed and opened positions.

6. The aisle containment roof system of claim 2, further comprising a control module to control the operation of the electromagnetic assembly.

7. The aisle containment roof system of claim 6, wherein the control module is configured to move the electromagnetic assembly between a magnetized condition in which the electromagnetic assembly retains the movable perforated panel in the other of the closed and opened positions and an de-magnetized condition in which the electromagnetic assembly releases the movable perforated panel to allow the movable perforated panel to move to the one of the closed and opened positions.

8. The aisle containment roof system of claim 7, further comprising an alarm coupled to the control module and configured to activate when the electromagnetic assembly disengages the movable perforated panel.

9. The aisle containment roof system of claim 8, further comprising at least one includes spring loaded plunger to secure the frame to a frame structure.

* * * * *